US011843354B2

United States Patent
Saminathan et al.

(10) Patent No.: US 11,843,354 B2
(45) Date of Patent: Dec. 12, 2023

(54) PROTECTION CIRCUITRY

(71) Applicant: Cirrus Logic International Semiconductor Ltd., Edinburgh (GB)

(72) Inventors: Pradeep Saminathan, Edinburgh (GB); Graeme S. Angus, Edinburgh (GB); John B. Bowlerwell, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 248 days.

(21) Appl. No.: 17/346,767

(22) Filed: Jun. 14, 2021

(65) Prior Publication Data
US 2021/0399691 A1 Dec. 23, 2021

Related U.S. Application Data

(60) Provisional application No. 63/041,300, filed on Jun. 19, 2020.

(30) Foreign Application Priority Data

Jun. 29, 2020 (GB) .................................... 2009882

(51) Int. Cl.
*H03F 1/52* (2006.01)
*H02M 1/32* (2007.01)
*H03F 1/56* (2006.01)

(52) U.S. Cl.
CPC ............... *H03F 1/52* (2013.01); *H02M 1/32* (2013.01); *H03F 1/56* (2013.01); *H03F 2200/03* (2013.01);
(Continued)

(58) Field of Classification Search
CPC ... H03F 1/52; H03F 1/56; H03F 1/523; H03F 3/183; H03F 3/2173; H03F 3/185; H03F 3/187; H03F 3/217; H03F 3/2171; H03F 2200/03; H03F 2200/102; H03F 2200/171; H02M 1/32; H03M 1/66; G06F 3/16; H04R 3/007
(Continued)

(56) References Cited

U.S. PATENT DOCUMENTS

2004/0196072 A1 10/2004 Jiandong
2006/0262473 A1 11/2006 Neesgaard et al.
(Continued)

OTHER PUBLICATIONS

Combined Search and Examination Report under Sections 17 and 18(3), UKIPO, Application No. GB2206260.8, dated Oct. 11, 2022.
(Continued)

*Primary Examiner* — Andrea Lindgren Baltzell
*Assistant Examiner* — Khiem D Nguyen
(74) *Attorney, Agent, or Firm* — Jackson Walker L.L.P (57) ABSTRACT

The present invention relates to circuitry comprising: interpolation filter circuitry configured to receive a digital input signal and to output an interpolated digital signal; amplifier circuitry configured to generate an output signal based on the interpolated digital signal; and protection circuitry. The protection circuitry is configured to activate in response to detection of a fault condition at an output of the amplifier circuitry. The circuitry further comprises first detection circuitry configured to output a control signal to disable the protection circuitry on detection of a transient signal at an output of the interpolation filter circuitry that is unrelated to a fault.

27 Claims, 8 Drawing Sheets

(52) U.S. Cl.
CPC .. *H03F 2200/102* (2013.01); *H03F 2200/171* (2013.01)

(58) Field of Classification Search
USPC .............................. 330/2, 207 P, 298, 3, 183
See application file for complete search history.

(56) References Cited

U.S. PATENT DOCUMENTS

| | | | |
|---|---|---|---|
| 2009/0169022 A1* | 7/2009 | Kost | ........................ H03F 1/523 381/56 |
| 2012/0063045 A1 | 3/2012 | Shearon | |
| 2015/0340355 A1 | 11/2015 | Zhang et al. | |

OTHER PUBLICATIONS

Examination Report under Section 18(3), UKIPO, Application No. GB2009882.8, dated Jul. 13, 2021.
Combined Search and Examination Report under Sections 17 and 18(3), UKIPO, Application No. GB2009882.8, dated Nov. 5, 2020.

* cited by examiner

PROTECTION CIRCUITRY

FIELD OF THE INVENTION

The present disclosure relates to circuitry for protecting against a fault condition such as an over-current and/or over-voltage that may arise as a result of a fault such as a short circuit.

BACKGROUND

Integrated circuits (IC) commonly includes protection systems for protecting the IC, one or more functional blocks of the IC and/or a host system device that incorporates the IC (e.g. a mobile phone, tablet or laptop computer, earphone, earbud, headphone, gaming device or the like) from potentially damaging currents or voltages that may arise, in use of the IC, as a result of a manufacturing fault or an operational fault such as a short circuit or the like.

Such protection systems typically monitor a voltage or a current at one or more circuit nodes of the IC, and compare the monitored voltage or current to one or more thresholds to determine if a fault condition (e.g. a voltage or current that exceeds a threshold) exists. If the monitored voltage or current exceeds the threshold(s) then a protection mechanism is activated in order to reduce the risk of damage to the protected functional block(s) of the IC, the IC itself and/or the host device or system that incorporates the IC. Activation of the protection mechanism may disable the protected functional blocks, for example by disconnecting them from power supply rails of the IC.

For example, in an IC that includes an amplifier block, a fault that could give rise to a voltage or current that could damage the IC might be a short circuit between an output of the amplifier block and a power supply that powers the IC, a short circuit between the output of the amplifier block and a ground connection or headphone return or reference connection of the amplifier block, or (in the case where the amplifier block implements a differential amplifier) a short circuit between the amplifier outputs. Such a fault may give rise to a fault condition such as an over-current or an over-voltage condition. If such a fault condition is detected then the protection mechanism can be activated to protect the IC, its functional blocks and/or its host system or device.

In designing such protection systems a balance must be found between ensuring that the protection mechanism activates in the event of a fault that could give rise to a voltage or current that could damage the IC, and preventing false activation of the protection mechanism, for example in response to transient voltage or current spikes that are unrelated to a fault and do not give rise to a risk of damage to the IC or its functional blocks.

SUMMARY

According to a first aspect, the invention provides circuitry comprising:
 interpolation filter circuitry configured to receive a digital input signal and to output an interpolated digital signal;
 amplifier circuitry configured to generate an output signal based on the interpolated digital signal; and
 protection circuitry,
 wherein the protection circuitry is configured to activate in response to detection of a fault condition at an output of the amplifier circuitry, and
 wherein the circuitry further comprises first detection circuitry configured to output a control signal to disable the protection circuitry on detection of a transient signal at an output of the interpolation filter circuitry that is unrelated to a fault.

The first detection circuitry may be configured to compare the interpolated output signal to a threshold and to output the control signal to disable the protection circuitry if the interpolated output signal exceeds the threshold.

The threshold may be determined based on an impedance of a load to be driven by the amplifier circuitry.

The threshold may be selected from a plurality of threshold values based on an impedance of a load to be driven by the amplifier circuitry.

The first detection circuitry may be configured to:
 determine an envelope of a first interpolated version of the digital input signal;
 compare the determined envelope to the interpolated digital signal; and
 output the control signal to disable the protection circuitry if the interpolated output signal exceeds the envelope of the first interpolated version of the digital input signal.

The first detection circuitry may comprise retriggerable monostable circuitry configured to generate a signal for disabling the protection circuitry for a predetermined duration.

The predetermined duration may be programmable.

The circuitry may further comprise second detection circuitry configured to output a signal indicative of detection of a fault condition on detection of the fault condition.

The fault condition may comprise a current of a magnitude exceeding a magnitude of a reference current.

The second detection circuitry may comprise circuitry for comparing a current indicative of a current through an output device of the amplifier circuitry to the reference current and to output a signal indicative of detection of a fault condition if the current indicative of the current through the output device exceeds the reference current.

The magnitude of the reference current may be programmable.

The amplifier circuitry may comprise a plurality of output devices, and the circuitry may comprise current comparison circuitry for each of the plurality of output devices.

The fault condition may comprise a voltage of a magnitude exceeding a magnitude of a reference voltage.

The circuitry may further comprise filter circuitry operative to cause activation of the protection circuitry if the signal indicative of the fault condition persists for a predetermined period of time.

The filter circuitry may comprise logic circuitry, and the control signal output by the first detection circuitry may act as a gate signal to selectively enable or disable output of a logic high signal by the logic circuitry.

The circuitry may further comprise digital-to-analogue converter (DAC) circuitry configured to convert a digital input received from the interpolation filter circuitry into an analogue output signal.

The protection circuitry may be configured, on detection of the fault condition, to disable one or more subsystems of the DAC circuitry or the amplifier circuitry.

The one or more subsystems may comprise:
 charge pump circuitry of the DAC circuitry;
 bias circuitry of the DAC circuitry;
 clock generator circuitry of the DAC circuitry;
 reference circuitry;
 input stage circuitry of the amplifier circuitry; or
 output stage circuitry of the amplifier circuitry.

The DAC circuitry may be integrated with the amplifier circuitry.

The circuitry may implement an audio codec.

According to a second aspect the invention provides circuitry comprising:
an interpolation filter configured to receive a digital input signal and to output an interpolated digital signal;
an amplifier configured to generate an output signal based on the interpolated
protection circuitry configured to protect the amplifier in the event of an over-current condition at an output of the amplifier; and
detection circuitry configured to control operation of the protection circuitry based on the interpolated digital signal.

According to a third aspect the invention provides circuitry comprising:
interpolation filter circuitry;
over-current protection circuitry; and
detection circuitry, wherein the circuitry is configured to prevent activation of the over-current protection circuitry in the event of detection by the detection circuitry of a transient signal at an output of the interpolation filter circuitry arising as a result of a discontinuity in an input signal to the interpolation filter circuitry.

According to a fourth aspect the invention provides protection circuitry for protecting circuitry in a signal path,
wherein the circuitry is configured to generate an output signal based on a signal in the signal path,
wherein the protection circuitry is configured to activate in response to detection of a fault condition at an output of the circuitry, and
wherein the protection circuitry further comprises detection circuitry configured to output a control signal to disable the protection circuitry on detection of a condition that is unrelated to a fault.

The condition that is unrelated to a fault may comprise a transient signal in the signal path upstream of the amplifier circuitry.

The circuitry may comprise amplifier circuitry.

The circuitry may comprises digital to analogue converter (DAC) circuitry.

According to a fifth aspect the invention provides circuitry comprising:
interpolation filter circuitry configured to receive a digital input signal and to output an interpolated digital signal;
amplifier circuitry configured to generate an output signal based on the interpolated digital signal;
fault condition detection circuitry configured to detect a fault condition at an output of the amplifier circuitry;
protection circuitry configured to activate in response to detection of a fault condition at an output of the amplifier circuitry to protect the amplifier circuitry; and
overshoot detection circuitry configured to prevent activation of the protection circuitry on detection of a transient signal at an output of the interpolation filter circuitry that is unrelated to a fault.

According to a sixth aspect the invention provides protection circuitry comprising:
first detection circuitry in a feedforward path of the protection circuitry;
second detection circuitry in a feedback path of the protection circuitry,
wherein the second detection circuitry is operative to activate the protection circuitry on detection of a fault condition at an input of the feedback path; and
wherein the first detection circuitry is configured to disable the protection circuitry on detection of a transient signal at an input of the feedforward path that is unrelated to a fault.

According to a seventh aspect the invention provides integrated circuitry comprising the circuitry of any one of the first to sixth aspects.

According to an eighth aspect the invention provides a device comprising the circuitry of any one of the first to sixth aspects.

The device may comprise a mobile telephone, a tablet or laptop computer, a smart speaker, an accessory device, a headphone or set of headphones, an earphone, an earbud, a gaming device, a wearable device, a smartwatch or smart glasses, for example.

BRIEF DESCRIPTION OF THE DRAWINGS

Embodiments of the invention will now be described, strictly by way of example only, with reference to the accompanying drawings, of which.

DETAILED DESCRIPTION

Figure 1:
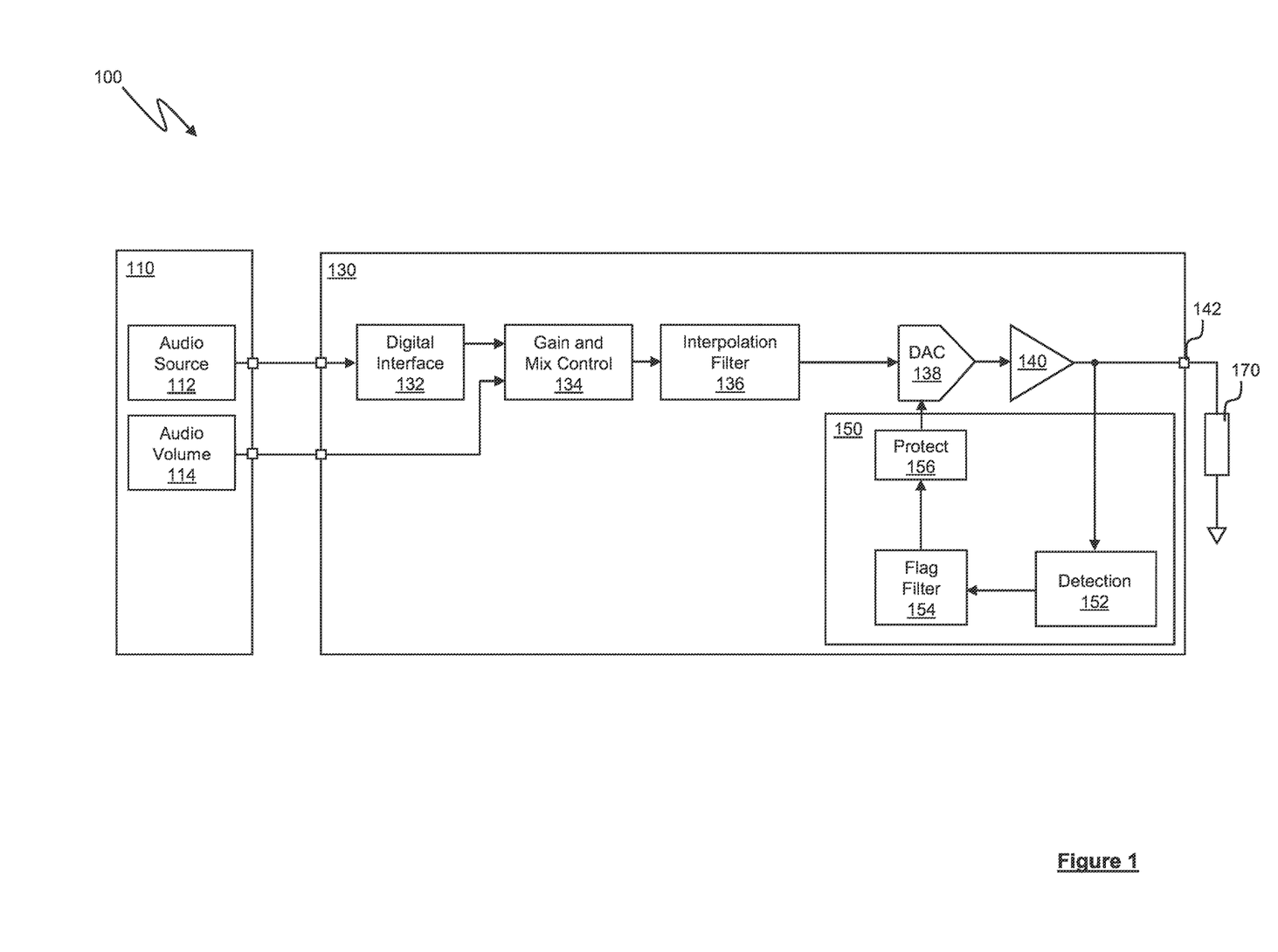
FIG. 1 is a schematic diagram showing a system including integrated circuitry that includes a protection system.

Referring first to FIG. 1, a system for driving an audio load such as a speaker is shown generally at 100. The system 100 includes processing circuitry 110, codec circuity (e.g. audio codec circuitry) 130 and a load 170. The load may be, for example, an audio transducer such as a speaker (e.g. of a headphone, earphone, earbud, smart speaker, wearable device such as a smartwatch or smart glasses or similar device) or the like, a haptic transducer such as a resonant actuator or the like, an ultrasonic transducer, a sensor such as a force sensor, or some other load. The system 100 may be incorporated in a host device such as a mobile phone, tablet or laptop computer, earphone, earbud, headphone or the like. Alternatively, a first portion of the system 100 (e.g. a portion comprising the processing circuitry 110) may be incorporated in a host device such as a mobile phone, tablet or laptop computer and a second portion of the system 100 (e.g. a portion comprising the codec circuitry 130 and the load 170) may be incorporated in an accessory device such as an earphone, earbud, set of headphones or wearable device (e.g. smartwatch, smart glasses etc.) that can be coupled, physically or wirelessly, to the host device.

The processing circuitry 110 includes one or more source blocks (e.g. audio source blocks) 112 which provide a digital signal (e.g. a digital audio signal), and a volume block (e.g.

an audio volume block) 114, which provides control information such as, for example, an indication of a desired volume of audio to be output by the load 170. The processing circuitry 110 may be, for example, an audio processor of a device such as a mobile phone, tablet or laptop computer, media player, gaming device or the like. The processing circuitry 110 may be physically coupled or couplable to the codec circuitry 130, e.g. by means of a wired connection (which may include a plug and socket arrangement to permit decoupling of the processing circuitry 110 from the codec circuitry 130), or may be wirelessly coupled or couplable to the codec circuitry 130, e.g. by means of a wireless protocol such as Bluetooth® or the like.

The codec circuitry 130 includes a digital interface block 132, which is configured to receive the digital audio signal from the at least one audio source block 112 of the processing circuitry and to output a digital audio signal to a gain and mix control block 134. The gain and mix control block 134 also receives a control signal from the audio volume block 114 of the processing circuitry 110, and applies an appropriate digital gain to the digital audio signal.

The gain and mix control block 134 outputs a digital audio signal to an interpolation filter block 136, which upsamples and filters the digital audio signal received from the gain and mix control block 134 to generate a higher sample-rate version of the received digital audio signal, which is output by the interpolation filter block 136 to a digital-to-analogue converter (DAC) block 138.

The DAC block 138 converts the digital audio signal received from the interpolation filter block 136 into an analogue signal, which is output by the DAC block 138 to an amplifier block 140.

The amplifier block 140 amplifies the analogue signal output by the DAC block 138 and outputs an amplified analogue audio signal to the audio load 170, via an output terminal 142 of the codec 130. The amplifier block 140 may implement a differential amplifier or a single-ended amplifier.

In the example illustrated in FIG. 1 the DAC block 138 and the amplifier block 140 are shown as separate blocks, but it will be appreciated by those of ordinary skill in the art that the DAC block 138 could be integrated with the amplifier block 140. Thus the amplifier block 140 could comprise amplifier circuitry and DAC circuitry.

The codec 130 also includes a protection system 150 which is operative to protect the DAC block 138 and/or the amplifier block 140 from potentially damaging currents or voltages that may arise in the event of a fault such as a short circuit (e.g. a short circuit between the output of the amplifier block 140 and a power supply that powers the codec 130, a short circuit between the output of the amplifier block 140 and a ground connection or headphone return or reference connection, or, in the case where the amplifier block 140 implements a differential amplifier, a short circuit between the amplifier outputs) or other fault that could give rise to a fault condition such as an over-current or over-voltage condition.

The protection system 150 includes a fault condition detection block 152, a flag filter block 154 and a protection block 156.

The fault condition detection block 152 is operative to output a flag signal indicative of whether or not a fault condition such as an over-current or over-voltage condition has been detected at the output of the amplifier block 140. By default the flag signal takes a logic low (e.g. 0V) value. However, if a current or voltage at the output of the amplifier block 140 exceeds a predetermined threshold value (which may be a fixed threshold or a programmable threshold) the flag signal adopts a logic high level.

The flag filter block 154 is operative to receive the flag signal output by the detection block 154, and to output a signal indicating that a fault condition has been detected to the protection block 156 if the flag signal remains high for a threshold period of time. The threshold period may be a fixed period of time or may be a programmable period of time. The flag filter block 154 reduces the risk of false activation of the protection block 156 as a result of transient conditions (e.g. short current or voltage peaks) at the output of the amplifier block 140 that are not indicative of a fault condition, or as a result of increased current through the load 170 at particular audio signal frequencies, which may occur if the load 170 is not purely resistive, such that peak current through the load 170 varies with the frequency of the signal output by the amplifier block 140.

The protection block 156 is operative to receive the signal output by the flag filter block 154. If the signal output by the flag filter block 154 indicates that a fault condition has been detected, the protection block 156 is activated to disable the DAC block 138 and/or the amplifier block 140, or subsystems of those blocks, so as to prevent further potentially damaging currents or voltages from reaching those blocks. For example, the protection block 156 may disable one or more of: a charge pump, bias circuit or clock generator for the DAC block 138; reference circuitry (e.g. a reference voltage common mode buffer circuitry); an input stage of the amplifier block 140; and/or an output stage of the amplifier block 140. In this way the DAC block 138 and/or the amplifier block 140 and the system 100 as a whole can be protected from potentially damaging effects that may arise as a result of a fault.

A problem that can arise in the system 100 of FIG. 1 is that discontinuities in the input digital signal or stream can cause transient signals at the output of the amplifier block 140, which may be incorrectly interpreted by the protection system 150 as being indicative of a fault. Such discontinuities may arise, for example, as a result of instantaneous (or near-instantaneous) switching between two or more different audio signal sources in the processing circuitry 110, or as a result of a change in the frequency content in an audio signal or stream. In such circumstances a transient signal (e.g. a transient current) having a magnitude that exceeds the threshold value used in the fault condition detection block 152 may arise at the output of the amplifier block 140. Although no fault has occurred, this transient signal may cause the fault condition detection block 152 to output a flag signal indicative of detection of a fault condition, leading to activation of the protection block 156, causing the DAC block 138 and/or the amplifier block 140 (or subsystems thereof) to be disabled as described above.

As will be appreciated, false activation of the protection block 156 in this way is undesirable, as it unnecessarily interrupts operation of the codec 130 and thus the audio output of the system 100, which degrades the experience of a user of a host device (e.g.

a mobile phone, tablet or laptop computer, media player, gaming device or the like) that incorporates the system 100.

Figure 2:
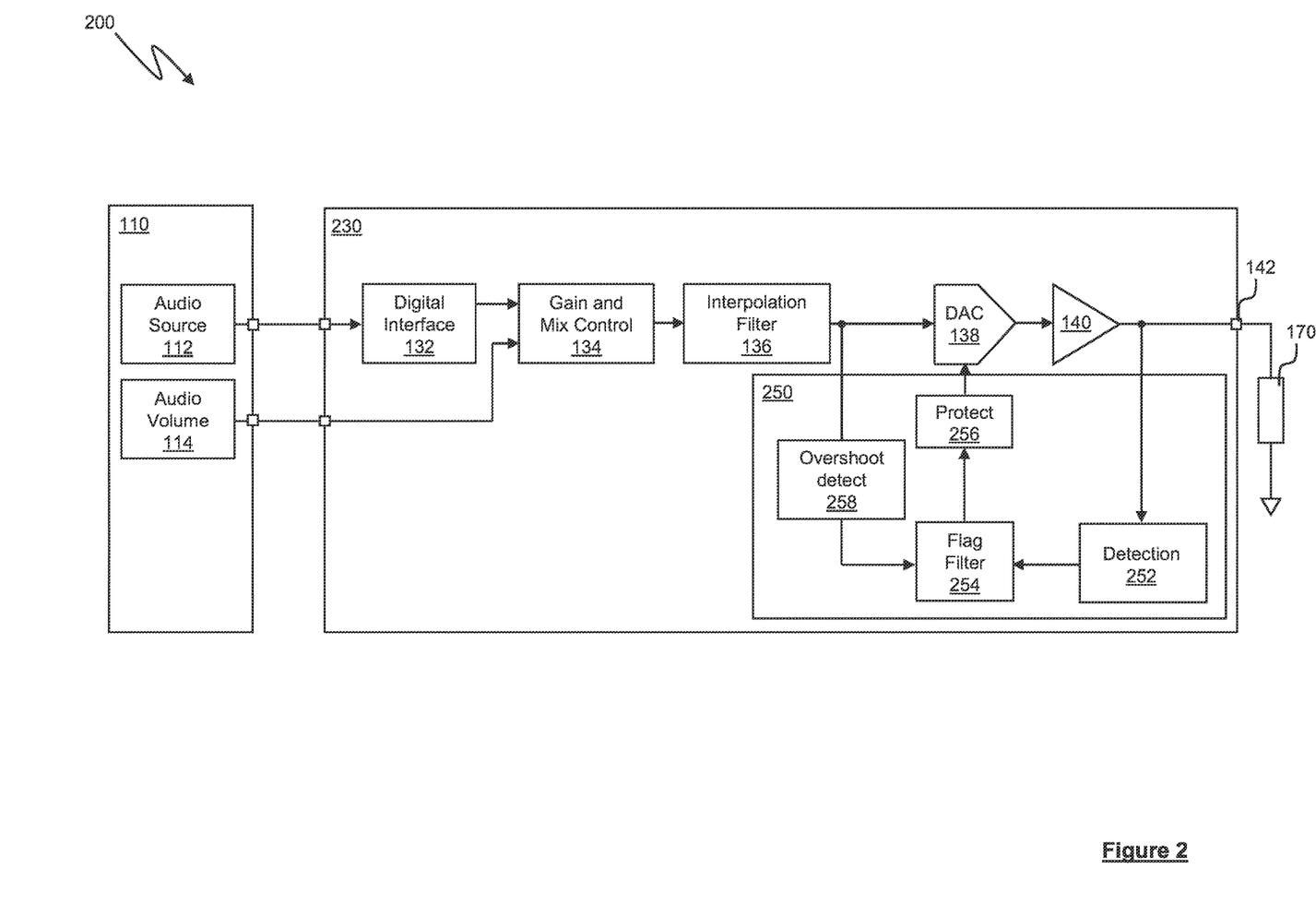
FIG. 2 is a schematic diagram showing a system including integrated circuitry that includes an improved protection system.

Turning now to FIG. 2, a system for driving an audio load such as a speaker is shown generally at 200. The system 200 includes processing circuitry 110 and an audio load 170 of the kind described above with reference to FIG. 1. The system 200 also includes codec circuitry (e.g. audio codec circuitry) 230, which includes some elements in common with the codec circuitry 130 of FIG. 1. Such common elements are denoted by common reference numerals in FIGS. 1 and 2 and are configured and operative in the manner described above, and thus will not be described in detail here, for the sake of brevity and clarity.

The codec circuitry 230 of the system 200 of FIG. 2 differs from the codec circuitry 130 of the system of FIG. 1 in that it includes an improved protection system 250 for protecting the DAC block 138 and/or the amplifier block 140 from potentially damaging currents or voltages that may arise in the event of a fault of the kind described above.

The protection system 250 includes a fault condition detection block 252, a flag filter block 254 and a protection block 256 in a feedback arrangement.

In addition, the protection system includes an overshoot detection block 258 in a feedforward arrangement. Because the overshoot detection block 258 is in a feedforward path of the protection system 250 (from the output of the interpolation filter 136), it may be referred to as a first detection block, whereas the fault condition detection block 252 may be referred to as a second detection block, since it is in a feedback path of the protection system 250 (from the output of the amplifier block 140).

The overshoot detection block 258 is operative to receive a signal from the output of the interpolation filter block 136 and, based on this received signal, control the operation of the protection block 256. In particular, the overshoot detection block 258 is operative to output a signal to selectively enable or disable the output of the flag filter block 254, based on the signal received from the output of the interpolation filter block 136, in order to prevent activation of the protection block 256 on detection of a signal output by the interpolation filter block 136 that is not indicative of a fault, but that would otherwise cause false activation of the protection block 256 once converted by the DAC block 138 and amplified by the amplifier block 140.

The overshoot detection block 258 may compare a level of the signal output by the interpolation filter block 136 to a threshold to determine if the signal would cause false activation of the protection block 256. Alternatively, the overshoot detection block 258 may determine if the signal would cause false activation of the protection block 256 based on a parameter of the signal, such as, for example, an envelope of the signal that is output by the interpolation filter block 136, as will be described in more detail below.

The codec 230 has been described above in terms of functional blocks. Those of ordinary skill in the art will appreciate that the functional blocks described above could be implemented in hardware (e.g. circuitry) or could be implemented as software executing on appropriate processing hardware (e.g. a processor, DSP, FPGA, ASIC or the like), or could be implemented as a combination of hardware (e.g. circuitry) and software executing on appropriate processing hardware.

Thus the codec circuitry 230 may be said to include protection circuitry 250 for protecting circuitry (which may comprise the amplifier block 140 and/or the DAC block 138) in a signal path. The signal path in the example illustrated in FIG. 2 is from the output of the interpolation filter block 136 to the output terminal 142. The circuitry (e.g. amplifier block 140 and/or DAC block 138) is configured to generate an output signal based on a signal in the signal path, and the protection circuitry 250 is configured to activate in response to detection of a fault condition at an output of the circuitry. The protection circuitry 250 also includes detection circuitry 258 configured to output control signal to disable the protection circuitry 250 on detection of a condition that is unrelated to a fault, such as a transient signal in the signal path upstream of the circuitry that is unrelated to a fault.

Figure 3:
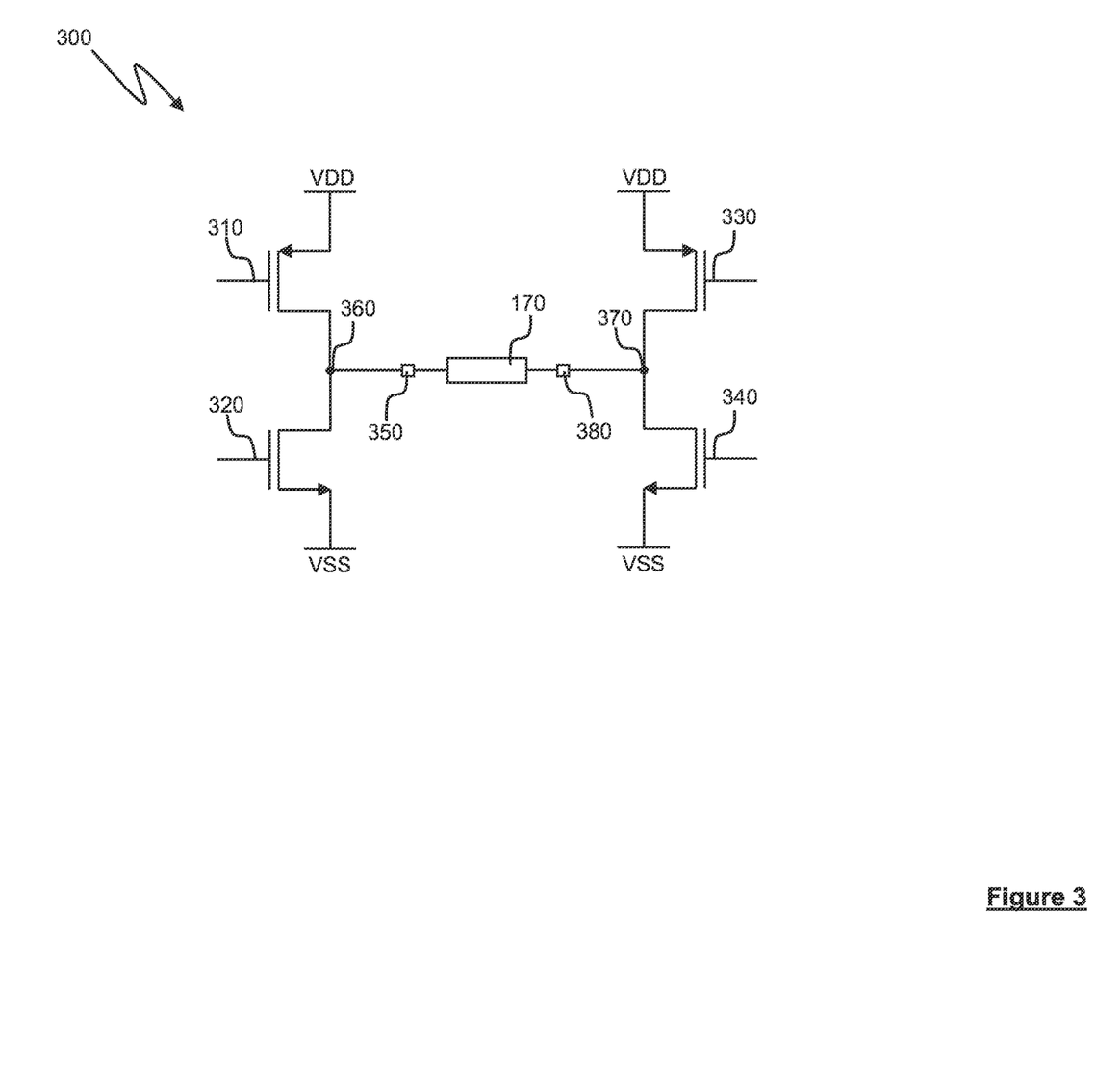
FIG. 3 is a schematic diagram showing an output stage of an amplifier block of the integrated circuitry of FIG. 2.

FIG. 3 is a schematic diagram showing an example output stage of the amplifier block 140 of the codec 230 of FIG. 2. In the illustrated example the output stage (shown generally at 300 in FIG. 3) is for a differential amplifier. The output stage 300 comprises first to fourth switching devices 310-340 arranged in an H-bridge configuration between positive (VDD) and reference (VSS) supply voltage rails. In the illustrated example the first and third switching devices 310, 330 are PMOS devices, and the second switching and fourth switching devices 320, 340 are NMOS devices. A first terminal of the load 170 is coupled to a first amplifier output terminal 350, which is coupled to a first node 360 between the first and second switching devices 310, 320, and a second terminal of the load 170 is coupled to a second amplifier output terminal 370, which is coupled to a second node 370 between the third and fourth switching devices 330, 340.

Figure 4:
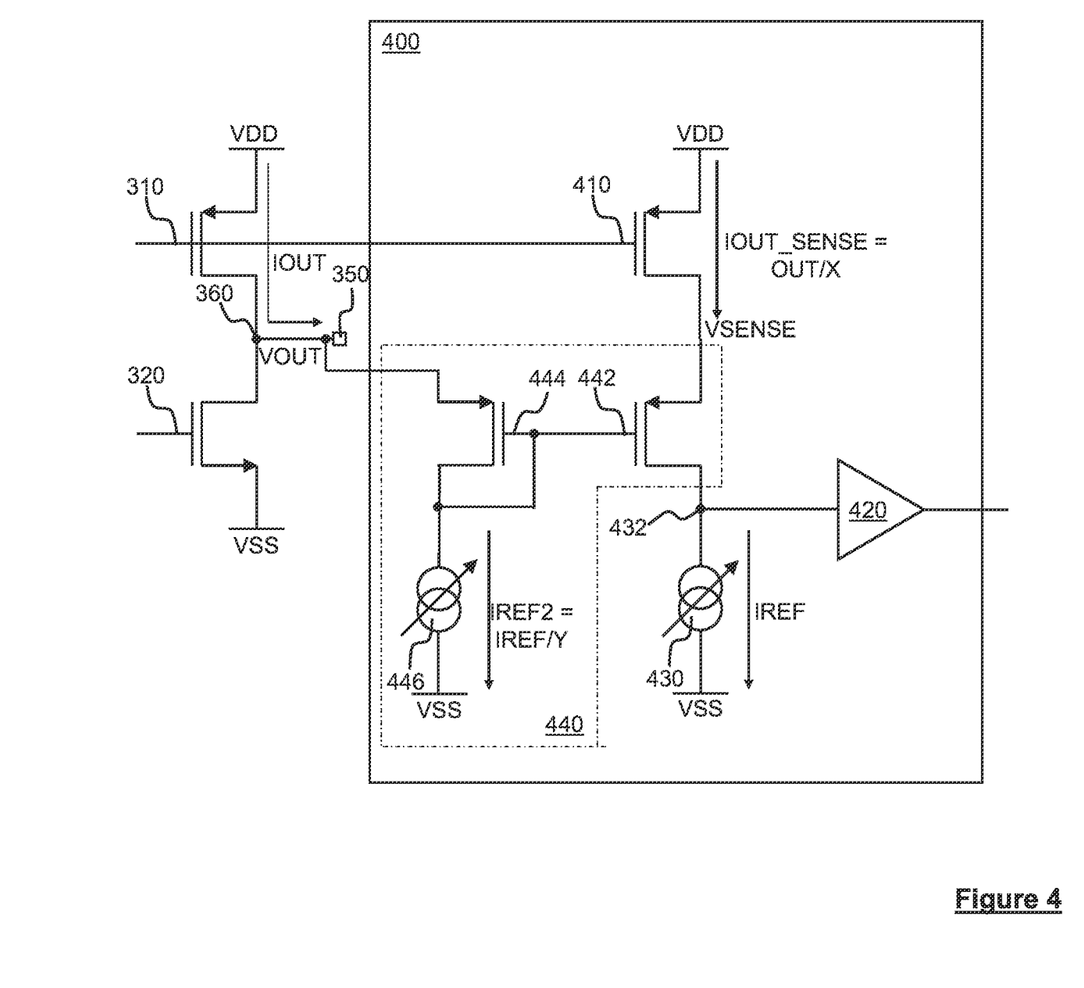
FIG. 4 is a schematic diagram illustrating current detection circuitry for the output stage of FIG. 3.

Each of the first to fourth switching devices 310—340 is provided with current detection circuitry, as will now be described with reference to FIG. 4, which is a schematic diagram showing example current detection circuitry for the first switching device 310 of the output stage 300 shown in FIG. 3. Similar current detection circuitry is provided for each of the second, third and fourth switching devices 320—340. By providing current detection circuitry for each of the switching devices 310—340, different faults, including short circuits between the load 170 and positive voltage supply rail, short circuits between the load and a negative or ground/reference voltage supply rail, and short circuits between the first and second output terminals 350, 370 of the output stage 300 can be detected and identified.

The current detection circuitry 400 (which is an example of circuitry that could be used in the fault condition detection block 252) includes a current sense device 410, which in the illustrated example is a PMOS device. The current sense device 410 is smaller than the first switching device 310 (e.g. the gate width WX of the first switching device 310 may be of the order of 10,000 times the gate width WA of the current sense device 410—i.e. X may be of the order of 10,000). The gate terminal of the current sense device 410 is coupled to the gate terminal of the first switching device 310 and to the positive (VDD) supply voltage rail so as to provide a scaled copy of the current through the first switching device 310. Therefore, the current sense device 410 acts as a current mirror. Thus, if the current through the first switching device 310 is IOUT, then the current through the current sense device is scaled by a factor 1/X, i.e. the current IOUT_SENSE through the current sense device 410 is equal to IOUT/X.

The current detection circuitry 400 further includes amplifier circuitry 420 and a first variable reference current source 430. The first variable reference current source 430 is coupled between a node 432 that is coupled to an input of the amplifier circuitry 430 and the reference voltage supply (VSS) rail. The first variable reference current source 430 is configured to generate a first variable reference current IREF that flows from the node 432 to the reference voltage supply (VSS) rail.

The node 432 also receives the current IOUT_SENSE. While the current IOUT_SENSE is less than the first variable reference current IREF, a voltage at an output of the amplifier circuitry 420 takes a logic low level (e.g. 0V). When the current IOUT_SENSE exceeds the first variable reference current IREF, the voltage at the output of the amplifier circuitry 420 switches to a logic high level (e.g. VDD). If the logic level at the output of the amplifier circuitry 420 is high a flag indicating detection of a fault condition (which in this example is an over-current condition in the amplifier block 140) can be set, and this flag can be processed by the flag filter block 254 to activate the protection block 256 if necessary.

Because the logic level at the output of the amplifier circuitry 420 is dependent upon the current IOUT_SENSE through the current sense device 410 (which is a scaled copy of the current IOUT through the first switching device 310) and the first variable reference current IREF output by the first variable reference current source 430, changing the first variable reference current IREF will change the level of current IOUT through the first switching device 310 that will cause the output of the amplifier circuitry 420 to go high to flag an over-current condition. Thus the current detection circuitry 400 can be configured and reconfigured to detect over-current conditions for different current levels that may arise, for example, from different load impedances and/or audio sources etc.

In operation of the current detection circuitry 400 a voltage VOUT at a drain terminal of the first switching device 310 can vary over the entire output voltage range of the amplifier block 140, whereas a voltage VSENSE at a drain terminal of the current sense device 410 is very small. This disparity between VOUT and VSENSE can lead to errors in the accuracy of the current IOUT_SENSE, which can adversely affect detection of potentially damaging currents through the first switching device 310.

To address this disparity issue the current detection circuitry 252 includes additional circuitry 440 including a first PMOS device 442, a second PMOS device 444 and a second variable reference current source 446.

A source terminal of the first PMOS device 442 is coupled to the drain terminal of the current sense device 410. A drain terminal of the first PMOS device 442 is coupled to the node 432. A gate terminal of the first PMOS device 442 is coupled to a gate terminal of the second PMOS device 444.

The gate terminal of the second PMOS device 444 is coupled to its drain terminal, whilst the source terminal of the second PMOS device 444 is coupled to the first output terminal 350 of the output stage 300 and the high-side of the first variable current source 430.

The second variable reference current source 446 is coupled between the drain terminal of the second PMOS device 444 and the reference supply voltage (VSS) rail.

The second PMOS device 444 is a scaled version of (i.e. is smaller than) the first PMOS device 442. For example, if the gate width of the first PMOS device 442 is B, then the gate width of the second PMOS device is B/Y. Thus, the first PMOS device 442 copies a proportion of the current through the second PMOS device 444 and thus acts as a current mirror.

The second variable reference current source 446 is configured to generate a second variable reference current IREF2 based on the first variable reference current IREF, scaled by a factor corresponding to the ratio of the gate width of the first PMOS device 442 to the gate width of the second PMOS device 444. Thus, if the gate width of the first PMOS device 442 is B and the gate width of the second PMOS device is B/Y, the second reference current IREF2 is equal to IREF/Y.

The additional circuitry 440 is thus operative to match the voltage at the first output terminal 350 to the voltage VSENSE at the drain terminal of the current sense device 410, thereby reducing inaccuracy in the current IOUT_SENSE through the sense device 410 and consequently reducing the likelihood of false negatives (i.e. a potentially damaging current I_OUT through the first switching device 310 that does not cause the output of the amplifier circuitry 420 to go high, thus setting a flag) or false positives (i.e. a current I_OUT through the first switching device 310 that unnecessarily causes the output of the amplifier circuitry 420 to go high, thus needlessly setting a flag) at the output of the current detection circuitry 252.

Figure 5:
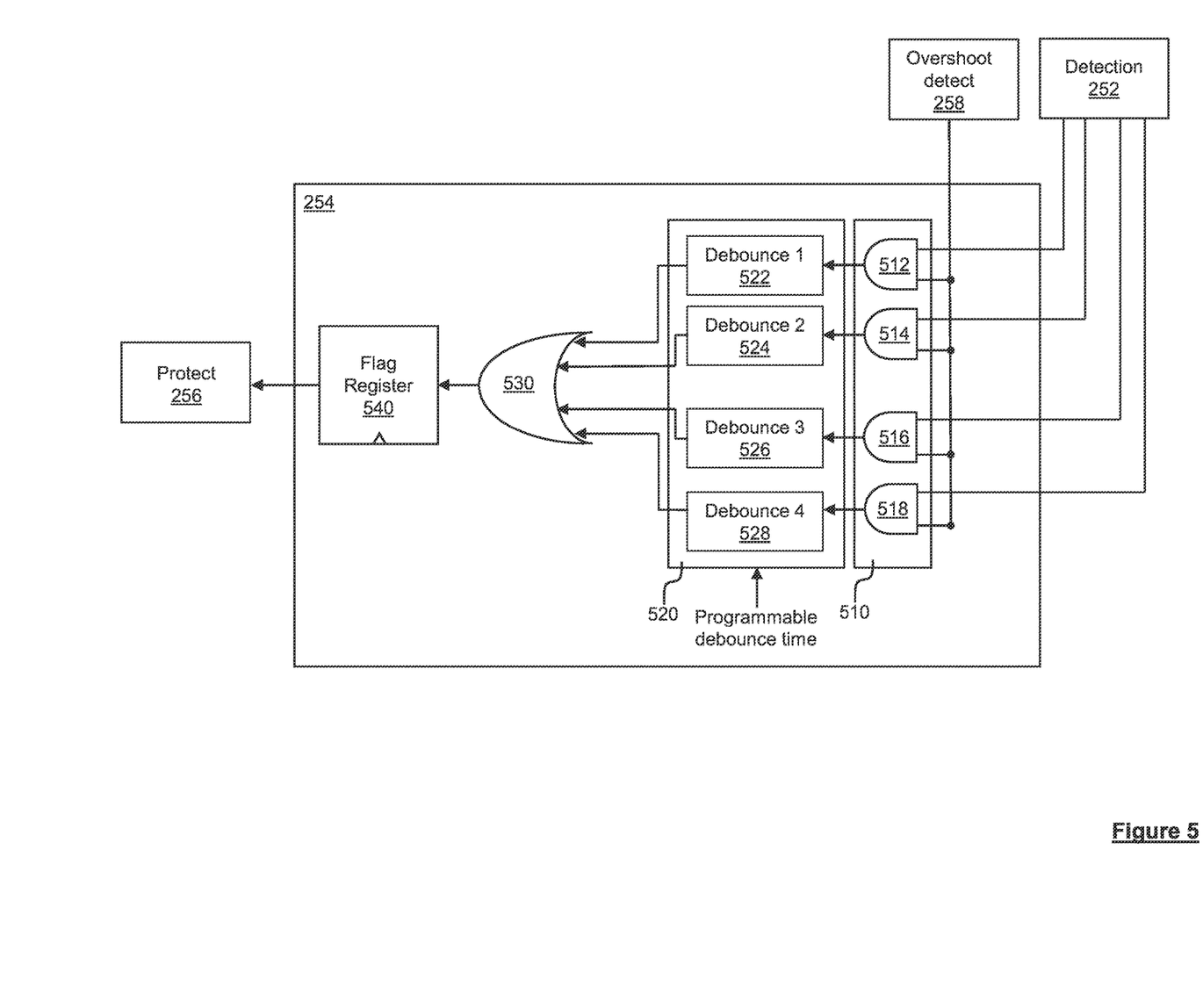
FIG. 5 is a schematic diagram illustrating a flag filter block of the system illustrated in FIG. 2.

FIG. 5 is a schematic diagram illustrating in more detail the flag filter block 254 of the system 200 illustrated in FIG. 2.

The flag filter block 254 includes logic circuitry 510 comprising first to fourth AND gates 512—518, a bank 520 of debounce filters comprising first to fourth debounce filters 522—528, an OR gate 530 and a current detect flag register 540. It will be appreciated by those of ordinary skill in the art that the logic circuitry 510 and/or bank 520 of debounce filters could comprise more or less than the illustrated first to fourth AND gates 512—51 and first to fourth debounce filters 522—528 depending on how many levels of detection are required.

As discussed above in relation to FIGS. 3 and 4, the amplifier block 140 may implement a differential amplifier using first to fourth switching devices 310—340. In such an arrangement four detection signals, which may be either high (indicating detection of a fault condition) or low (indicating that no fault condition has been detected), are output by the detection block 252 to the flag filter block 254.

Each detection signal is received at a first input of a respective one of the AND gates 512—518 of the logic circuitry 510. A second input of each of the AND gates receives a control signal output by the overshoot detection block 258. Thus a logic high signal is output by each AND gate 512—518 if the control signal received at the second input of the AND gate 512—518 from the overshoot detection block 258 is high and if the detection signal received at the first input of the AND gate 512—518 is also high. The control signal output by the overshoot detection block 258 thus acts as a gate signal to selectively enable or disable output of a logic high signal by each of the AND gates 512—518 of the logic circuitry 510.

The output of each AND gate 512—518 is coupled to an input of a respective debounce filter 522—528, and an output of each of the debounce filters 522—528 is coupled to a respective input of the OR gate 530. An output of the OR gate 530 is coupled to an input of the current detect flag register 540.

Each of the debounce filters 522—528 is configured to output a logic high signal if the signal at its input persists (i.e. remains high) for a predefined debounce time period. This helps to avoid false activation of the protection block 256 resulting from transient current and/or voltage events at the output of the amplifier block 140. The debounce time for each of the debounce filters 522—528 is programmable by means of a common and/or individual control signal input to the debounce filter bank 520.

The OR gate 530 has, in this example, four inputs, each of which is coupled to an output of a respective one of the debounce filters 522—528. Thus if any one of the debounce filters 522—528 outputs a logic high signal, the output of the OR gate 530 will go high.

An input of the flag register 540 is coupled to the output of the OR gate 530 so as to receive the logic signal output by the OR gate 530. If a logic high signal is received at the input of the flag register 540, a flag is set (i.e. the flag register 540 provides a logic high output), and remains set until reset to its default logic low output state by an appropriate reset signal. Thus the flag register 540 acts as a Set/Reset register. The flag is output to the protection block 256 and causes activation of the protection block 256 to protect the DAC block 138 and/or the amplifier block 140 (or subsystems thereof) from potentially damaging currents.

Figure 6:
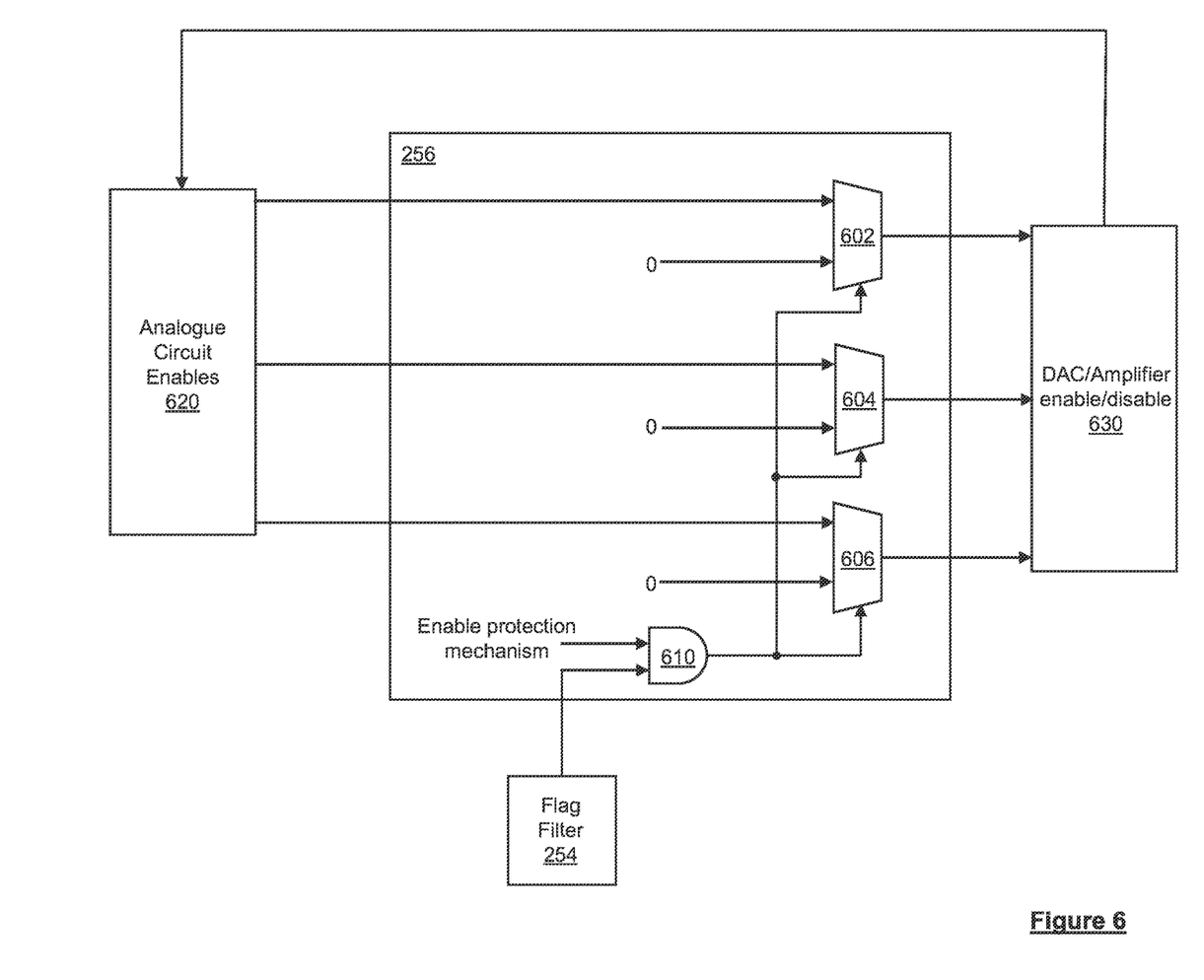
FIG. 6 is a schematic diagram illustrating a protection block of the system illustrated in FIG. 2.

FIG. 6 is a schematic diagram illustrating in more detail the protection block 256 of the system illustrated in FIG. 2.

The protection block 256 includes first to third multiplexers 602—606 and an AND gate 610.

Each of the multiplexers 602—606 has a first input that receives a logic signal from a register or memory 620, external to the protection block 256, indicating a status (enabled/disabled) of analogue circuitry of the codec 230 such as the DAC block 130 (and/or subsystems thereof) and the amplifier block 140 (and/or subsystems thereof). This analogue circuitry is enabled when an output path comprising blocks 132—140 of the codec circuitry 230 is to be used to drive the load 170, and thus the logic signals received at the first inputs of the multiplexers 602—606 are high when the output path is enabled.

Each of the multiplexers 602—606 also has a second input that receives a fixed logic low (or 0) signal.

Outputs of the multiplexers 602—606 are coupled to circuitry 630 that enables or disables the DAC block 130 (and/or subsystems thereof) and/or the amplifier block 140 (and/or subsystems thereof) based on the signals output by the multiplexers 602—608. For example, the circuitry 630 may enable or disable one or more of charge pump circuitry of the DAC block 130, bias circuitry of the DAC block 130, clock generator circuitry of the DAC block 130, common mode buffer circuitry, an input stage of the amplifier block 140 and/or an output stage of the amplifier block 140. Disabling the DAC block 130 and/or the amplifier block 140 (or a subsystem thereof) may entail decoupling the DAC block 130 and/or the amplifier block 140 or the subsystem from a power supply, whilst enabling the DAC block 130 and/or the amplifier block 140 (or a subsystem thereof) may entail coupling the DAC block 130 and/or the amplifier block 140 or the subsystem to the power supply.

An output of the AND gate 610 is coupled to a control input of each of the multiplexers 602—606 so as to provide a control signal that governs which of the input signals received by each multiplexer 602—606 is output by each multiplexer 602—606. The AND gate 610 receives, at a first input thereof, a logic signal indicative of whether the protection mechanism of the codec 230 is enabled. The protection mechanism if the codec 230 is enabled by default on start-up of the codec 230 and thus the logic signal received at the first input of the AND gate 610 is usually high.

The AND gate 610 receives, at a second input thereof, a logic signal output by the flag filter block 254. As discussed above, the output of the flag filter block 254 is a logic high signal if a fault such as an overcurrent event is detected at the output of the amplifier block 140 by the detection block 252.

When such a fault is detected, the output of the AND gate 610 goes high, because its inputs are both high. This causes the multiplexers 602—606 to select the signals at their second inputs to be output, such that the multiplexers 602—606 output logic low signals to the circuitry 630, to cause the circuitry 630 to disable the DAC block 130 (and/or one or more subsystems thereof) and/or the amplifier block 140 (and/or one or more subsystems thereof), thus protecting the DAC block 130 and/or the amplifier block 140 from potentially damaging currents that may arise as a result of the detected fault. A signal may also be sent by the circuitry 630 to the register or memory 620 to update the register or memory 620 to reflect the fact that the DAC block 130 and/or amplifier block 140 (or subsystems thereof) have been disabled.

Figure 7:
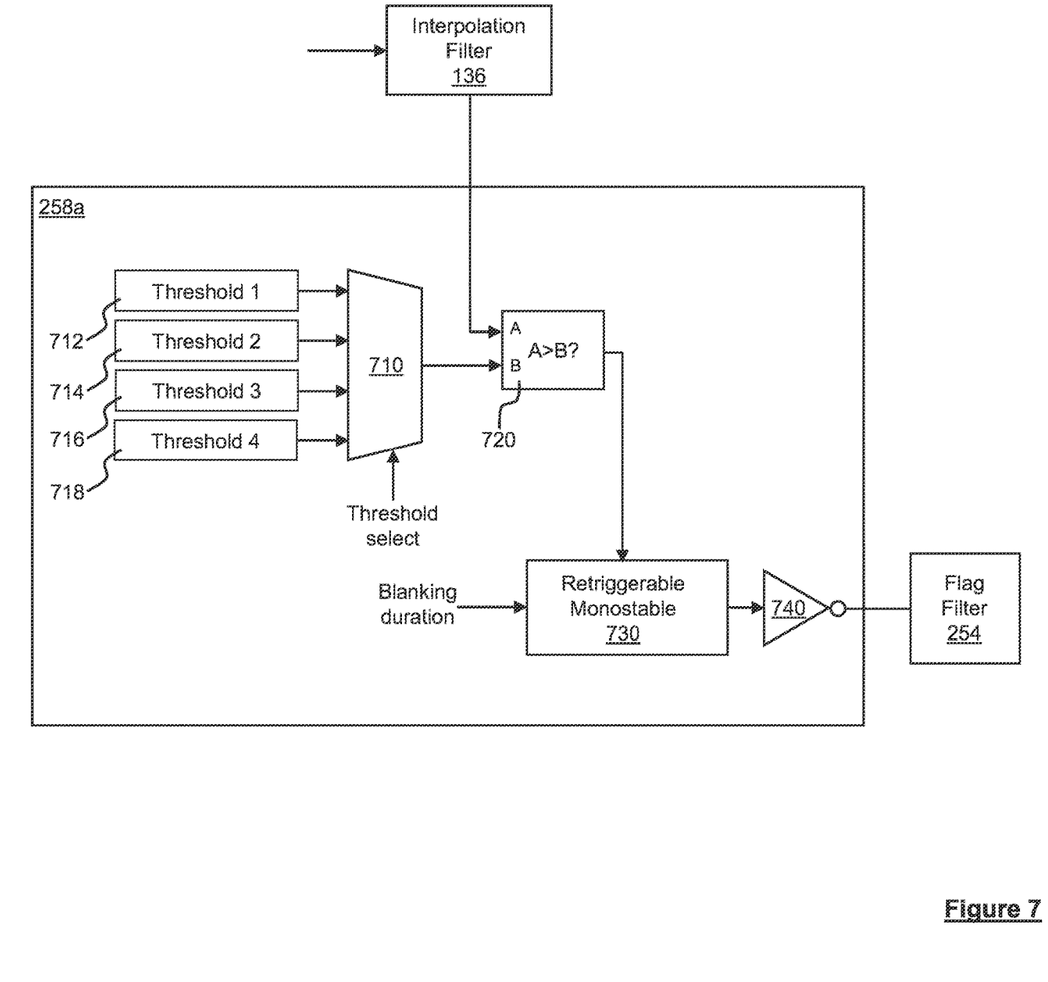
FIG. 7 is a schematic diagram illustrating an overshoot detection block suitable for use in the system illustrated in FIG. 2.

FIG. 7 is a schematic diagram illustrating an overshoot detection block suitable for use in the system illustrated in FIG. 2.

The overshoot detection block, denoted by the reference numeral 258a in FIG. 7 (to indicate that it is one possible example of the overshoot detection block 258), includes a multiplexer 710, a plurality (in this example four) of threshold value registers 712—718, each containing a respective threshold value, a comparator 720, a retriggerable monostable 730 and an inverter 740.

The comparator 720 receives, at a first input thereof, a signal output by the interpolation filter block 136. A second input of the comparator is coupled to an output of the multiplexer 710, such that the comparator 720 receives, at its second input, a threshold value of the plurality of threshold values selected by the multiplexer 710.

An output of the comparator 720 is coupled to a trigger input of the retriggerable monostable 730. The retriggerable monostable 730 receives a control signal to set its time period, which determines a "blanking duration" during which the flag filter block 254 is effectively disabled, as will be explained below. An output of the retriggerable monostable is coupled to an input of the inverter 740, and an output of the inverter 740 is coupled to the second input of each of the AND gates 512—518 of the flag filter block 254.

If a level of the signal received at the first input of the comparator 720 from the interpolation filter is greater than the selected threshold value that is received at the second input of the comparator 720, the comparator 720 outputs a logic high signal to the retriggerable monostable 730. This causes a signal output by the retriggerable monostable 730 to go high for the blanking duration. The signal output by the inverter 740 is therefore low for the blanking duration, and this causes the outputs of the AND gates 512—518 to remain low for the blanking duration, such that any signal output by the detection block 252 is effectively ignored for the blanking duration, thus preventing the protection block 256 from activating for the blanking duration.

Thus, the overshoot detection block 258a block provides look-ahead functionality that is able to prevent false activation of the protection block 256 in response to a transient signal at the output of the interpolation filter 136 that is not indicative of a fault but instead arises, for example, as a result of a time or frequency discontinuity in a signal that is input to the interpolation filter 136.

Because the impedance of the load 170 can vary for different loads (e.g. different sets of headphones can have different impedances, e.g. 16Ω, 32Ω or higher), a current at the output of the amplifier block 140 that would exceed the reference current IREF of the detection block 252 for a load 170 of a particular impedance (e.g. 16Ω), and would thus cause activation of the protection block 256, would not necessarily exceed the reference current IREF of the detection block 252 for a load 170 of a different impedance (e.g. 32Ω), and so would not necessarily cause activation of the protection block 256.

Thus, where the fault condition detection circuitry is configured for over-current detection, the selection of the threshold to which the signal output by the interpolation filter 136 is compared should be based, at least in part, on the expected or measured impedance of the load 170. To this end a plurality (four, in the example illustrated in FIG. 7) of different thresholds are provided in the threshold registers 712—718, each appropriate for a different load impedance, and the multiplexer 710 may receive a threshold select control signal based on the impedance of the load 170 to cause it to select an appropriate one of the thresholds for use by the comparator 720.

The impedance of the load 170 may be estimated or measured by other circuitry of a host device such as a mobile phone that incorporates the codec 230, and the control signal to the multiplexer 710 may be based on the output of such circuitry may be used to select the appropriate threshold.

In an alternative example the multiplexer 710 and the threshold registers 712—718 may be omitted and the threshold to which the signal output by the interpolation filter 136 is compared by the comparator 720 may be determined dynamically, based on the measured or estimated impedance of the load 170. The threshold may be determined, for example, by the overshoot detection block 258a or the codec 230 or by processing circuitry of the host device that is external to the overshoot detection block 258a or external to the codec 230.

Figure 8:
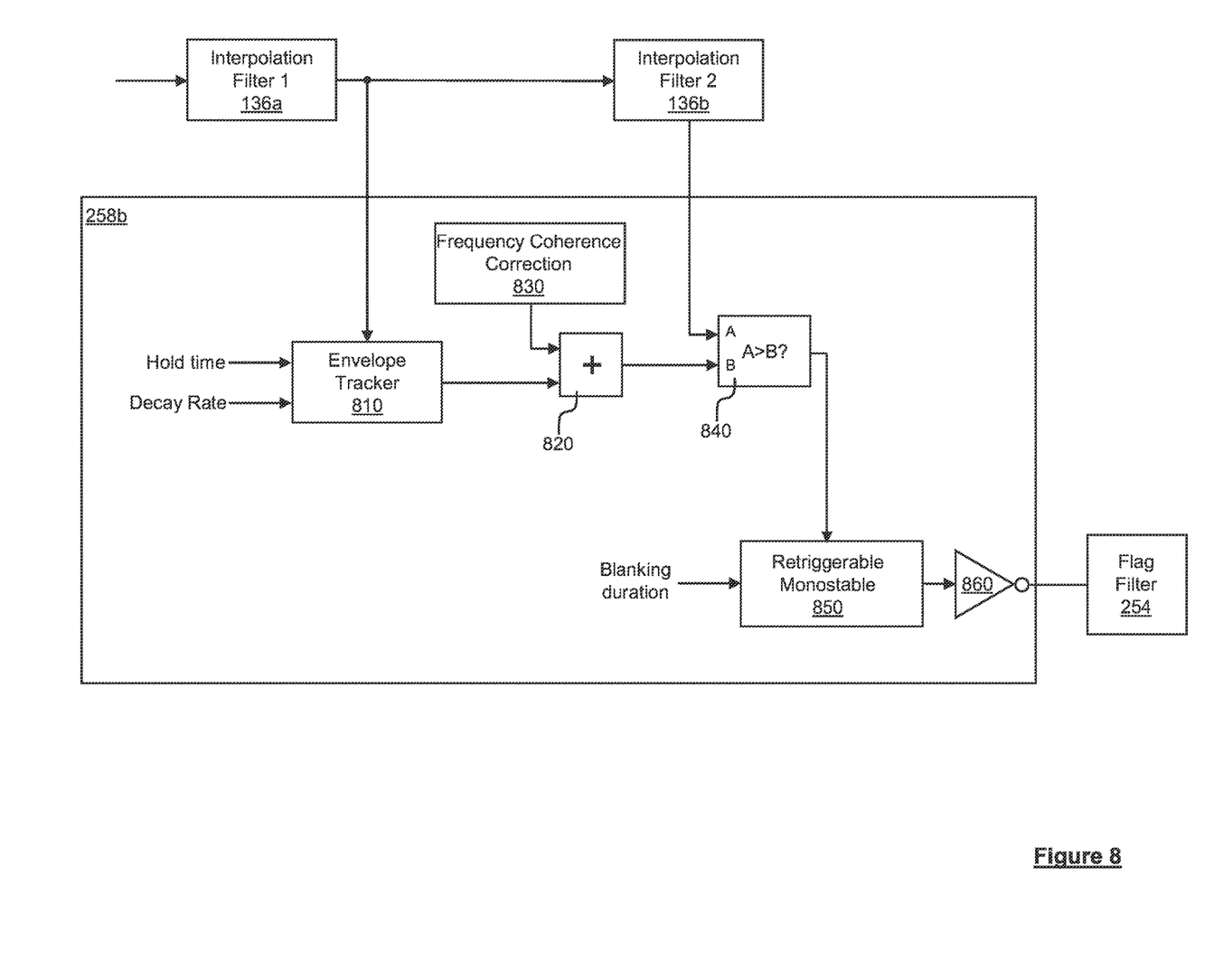
FIG. 8 is a schematic diagram illustrating an alternative overshoot detection block suitable for use in the system illustrated in FIG. 2.

FIG. 8 is a schematic diagram illustrating an alternative overshoot detection block suitable for use in the system illustrated in FIG. 2.

The overshoot detection block, denoted by the reference numeral 258b in FIG. 8 (to indicate that it is another possible example of the overshoot detection block 258), includes an envelope tracker 810, an adder 820, frequency coherence correction circuitry 830, a comparator 840, a retriggerable monostable 850 and an inverter 860. The retriggerable monostable 850 and an inverter 860 are similar to the retriggerable monostable 730 and inverter 740 described above with reference to FIG. 7, and thus will not be described in detail here.

In the example illustrated in FIG. 8 the interpolation filter block 136 includes a first interpolation filter 136a and a second interpolation filter 136b. The envelope tracker 810 has a programmable hold time and decay rate, which are programmed via appropriate control signals. The envelope tracker 810 receives a signal output by the first interpolation filter 136a and outputs an envelope signal, indicative of the envelope of the signal output by the first interpolation filter 136a, to the adder 820. The frequency coherence correction circuitry 830 provides a signal to correct any error in the envelope signal. A corrected envelope signal is output by the adder 820 to the comparator 840.

The comparator 840 compares the corrected envelope signal output by the adder 820 to a level of a signal output by the second interpolation filter 136b. If the level of the signal output by the second interpolation filter 136b is greater than the corrected envelope signal (indicating a temporary or transient overshoot in the signal input to the interpolation filter block 136), its output goes high, triggering the retriggerable monostable 850, which in turn causes the output of the inverter 860 to go low for the blanking duration, thereby causing the outputs of the AND gates 512—518 of the flag filter 254 to remain low for the blanking duration, such that any signal output by the detection block 252 is effectively ignored for the blanking duration, thus preventing the protection block 256 from activating for the blanking duration.

Thus, the overshoot detection block 258b also provides look-ahead functionality that is able to prevent false activation of the protection block 256 in response to a transient signal at the output of the interpolation filter 136 that is not indicative of a fault condition but instead arises, for example, as a result of a time or frequency discontinuity in a signal that is input to the interpolation filter 136. Because the overshoot detection block 258b of FIG. 8 does not compare the signal output by the interpolation filter 136 to any threshold, it has the benefit that the impedance of the load 170 does not need to be known or determined in order to detect a transient or temporary overshoot.

The current detection circuitry 400 described above is an example of circuitry that could be used in the fault condition detection block 252 to detect an over-current condition that may be indicative of a fault such as a short circuit in the system 200, and the flag filter block 254, protection block 256 and overshoot detection block 258 described above with reference to FIGS. 5-8 in relation to detection of an over-current condition that may arise as a result of a fault.

However, as will be appreciated by those skilled in the art, other fault condition detection circuitry could be provided instead of or in addition to the current detection circuitry 400 in order to detect a fault condition and to output an appropriate signal on detection of a fault condition. For example, the fault detection block 252 could include voltage detection circuitry configured to detect a voltage of a magnitude that exceeds a threshold or a reference voltage magnitude, which may be indicative of a fault such as a short circuit in the system 200. Those of ordinary skill in the art will readily be able to make any adaptations to the flag filter block 254, protection block 256 and overshoot detection block 258 that may be necessary for operation with other fault detection circuitry such as over-voltage detection circuitry.

As will be apparent from the foregoing discussion, the present disclosure provides an effective mechanism for protecting circuitry from potentially damaging effects (e.g. damaging currents) arising from fault conditions such as short circuits, with improved resilience to transient effects that arise not as a result of a fault condition but as a result, for example, of frequency or time discontinuities in an input signal.

The invention has been described above in terms of functional blocks. Those of ordinary skill in the art will appreciate that the functional blocks described above could be implemented in hardware (e.g. circuitry) or could be implemented as software executing on appropriate processing hardware (e.g. a processor, DSP, FPGA, ASIC or the like), or could be implemented as a combination of hardware (e.g. circuitry) and software executing on appropriate processing hardware.

Embodiments may be implemented in a range of applications and in particular are suitable for audio applications.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry comprising:
   interpolation filter circuitry configured to receive a digital input signal and to output an interpolated digital signal;
   amplifier circuitry configured to generate an output signal based on the interpolated digital signal; and
   protection circuitry,
   wherein the protection circuitry is configured to activate in response to detection of a fault condition at an output of the amplifier circuitry, and
   wherein the circuitry further comprises first detection circuitry configured to output a control signal to disable the protection circuitry on detection of a transient signal at an output of the interpolation filter circuitry that is unrelated to a fault.

2. Circuitry according to claim 1 wherein the first detection circuitry is configured to compare the interpolated output signal to a threshold and to output the control signal to disable the protection circuitry if the interpolated output signal exceeds the threshold.

3. Circuitry according to claim 2 wherein the threshold is determined based on an impedance of a load to be driven by the amplifier circuitry.

4. Circuitry according to claim 2 wherein the threshold is selected from a plurality of threshold values based on an impedance of a load to be driven by the amplifier circuitry.

5. Circuitry according to claim 1 wherein the first detection circuitry is configured to:
   determine an envelope of a first interpolated version of the digital input signal;
   compare the determined envelope to the interpolated digital signal; and
   output the control signal to disable the protection circuitry if the interpolated output signal exceeds the envelope of the first interpolated version of the digital input signal.

6. Circuitry according to claim 2 wherein the first detection circuitry comprises retriggerable monostable circuitry configured to generate a signal for disabling the protection circuitry for a predetermined duration.

7. Circuitry according to claim 6 wherein the predetermined duration is programmable.

8. Circuitry according to claim 1 further comprising second detection circuitry configured to output a signal indicative of detection of a fault condition on detection of the fault condition.

9. Circuitry according to claim 8 wherein the fault condition comprises a current of a magnitude exceeding a magnitude of a reference current.

10. Circuitry according to claim 9 wherein the second detection circuitry comprises circuitry for comparing a current indicative of a current through an output device of the amplifier circuitry to the reference current and to output a signal indicative of detection of a fault condition if the current indicative of the current through the output device exceeds the reference current.

11. Circuitry according to claim 9 wherein the magnitude of the reference current is programmable.

12. Circuitry according to claim 11 wherein the amplifier circuitry comprises a plurality of output devices, and wherein the circuitry comprises current comparison circuitry for each of the plurality of output devices.

13. Circuitry according to claim 8 wherein the fault condition comprises a voltage of a magnitude exceeding a magnitude of a reference voltage.

14. Circuitry according to claim 8 further comprising filter circuitry operative to cause activation of the protection circuitry if the signal indicative of the fault condition persists for a predetermined period of time.

15. Circuitry according to claim 14 wherein the filter circuitry comprises logic circuitry, and wherein the control signal output by the first detection circuitry acts as a gate signal to selectively enable or disable output of a logic high signal by the logic circuitry.

16. Circuitry according to claim 1 wherein the circuitry further comprises digital-to-analogue converter (DAC) circuitry configured to convert a digital input received from the interpolation filter circuitry into an analogue output signal.

17. Circuitry according to claim 16 wherein the protection circuitry is configured, on detection of the fault condition, to disable one or more subsystems of the DAC circuitry or the amplifier circuitry, wherein the one or more subsystems comprise:
charge pump circuitry of the DAC circuitry;
bias circuitry of the DAC circuitry;
clock generator circuitry of the DAC circuitry;
reference circuitry;
input stage circuitry of the amplifier circuitry; or
output stage circuitry of the amplifier circuitry.

18. Circuitry according to claim 16 wherein the DAC circuitry is integrated with the amplifier circuitry.

19. Circuitry according to claim 1 wherein the circuitry implements an audio codec.

20. Circuitry comprising:
an interpolation filter configured to receive a digital input signal and to output an interpolated digital signal;
an amplifier configured to generate an output signal based on the interpolated digital signal;
protection circuitry configured to protect the amplifier in the event of an over-current condition at an output of the amplifier; and
detection circuitry configured to control operation of the protection circuitry based on the interpolated digital signal.

21. Circuitry comprising:
interpolation filter circuitry;
over-current protection circuitry; and
detection circuitry, wherein the circuitry is configured to prevent activation of the over-current protection circuitry in the event of detection by the detection circuitry of a transient signal at an output of the interpolation filter circuitry arising as a result of a discontinuity in an input signal to the interpolation filter circuitry.

22. Protection circuitry for protecting circuitry in a signal path,
wherein the circuitry is configured to generate an output signal based on a signal in the signal path,
wherein the protection circuitry is configured to activate in response to detection of a fault condition at an output of the circuitry,
wherein the protection circuitry further comprises detection circuitry configured to output a control signal to disable the protection circuitry on detection of a condition that is unrelated to a fault,
wherein the circuitry comprises amplifier circuitry, and
wherein the condition that is unrelated to a fault comprises a transient signal in the signal path upstream of the amplifier circuitry.

23. Protection circuitry according to claim 22 wherein the circuitry comprises digital to analogue converter (DAC) circuitry.

24. Circuitry comprising:
interpolation filter circuitry configured to receive a digital input signal and to output an interpolated digital signal;
amplifier circuitry configured to generate an output signal based on the interpolated digital signal;
fault condition detection circuitry configured to detect a fault condition at an output of the amplifier circuitry;
protection circuitry configured to activate in response to detection of a fault condition at an output of the amplifier circuitry to protect the amplifier circuitry; and
overshoot detection circuitry configured to prevent activation of the protection circuitry on detection of a transient signal at an output of the interpolation filter circuitry that is unrelated to a fault.

25. Integrated circuitry comprising the circuitry of claim 1.

26. A device comprising the circuitry of claim 1.

27. The device according to claim 26, wherein the device comprises a mobile telephone, a tablet or laptop computer, a smart speaker, an accessory device, a headphone or set of headphones, an earphone, an earbud, a gaming device, a wearable device, a smartwatch or smart glasses.

* * * * *